United States Patent
Akkinepally

(10) Patent No.: US 10,410,940 B2
(45) Date of Patent: Sep. 10, 2019

(54) SEMICONDUCTOR PACKAGE WITH CAVITY

(71) Applicant: Intel Corporation, Santa Clara, CA (US)

(72) Inventor: Praneeth Akkinepally, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/639,077

(22) Filed: Jun. 30, 2017

(65) Prior Publication Data

US 2019/0006252 A1  Jan. 3, 2019

(51) Int. Cl.

| H01L 23/48 | (2006.01) |
|---|---|
| H01L 23/13 | (2006.01) |
| H01L 23/522 | (2006.01) |
| H01L 23/00 | (2006.01) |
| H01L 23/538 | (2006.01) |
| H01L 25/10 | (2006.01) |
| H01L 25/16 | (2006.01) |

(52) U.S. Cl.
CPC .......... *H01L 23/13* (2013.01); *H01L 23/5226* (2013.01); *H01L 23/5389* (2013.01); *H01L 24/17* (2013.01); *H01L 25/10* (2013.01); *H01L 25/16* (2013.01); *H01L 2224/16225* (2013.01)

(58) Field of Classification Search
None
See application file for complete search history.

(56) References Cited

U.S. PATENT DOCUMENTS

| 8,729,709 | B2 * | 5/2014 | Baba ................. H01L 23/49822 |
|---|---|---|---|
| | | | 257/774 |
| 8,901,724 | B2 * | 12/2014 | Guzek ..................... H01L 24/19 |
| | | | 257/686 |
| 10,153,219 | B2 * | 12/2018 | Jeon ....................... H01L 23/045 |
| 2002/0190361 | A1 * | 12/2002 | Zhao ................... H01L 23/3677 |
| | | | 257/678 |

(Continued)

OTHER PUBLICATIONS

Sarrou, Philip, "Chip Scale Review Magazine," CSR Tech Monthly, 2014, 5 pages.

(Continued)

*Primary Examiner* — Ismail A Muse
(74) *Attorney, Agent, or Firm* — Trop, Pruner & Hu, P.C.

(57) ABSTRACT

An embodiment includes a method comprising: coupling a sacrificial material to a substrate; forming a first dielectric material adjacent the sacrificial material such that a horizontal axis intersects the first dielectric material and the sacrificial material; forming a first layer, on the first dielectric material and the sacrificial material, which includes a first metal interconnect and a third dielectric material; decoupling the substrate from the first dielectric material and the sacrificial material; removing the sacrificial material to form an empty cavity with sidewalls comprising the first dielectric material; after removing the sacrificial material to form the empty cavity, inserting a first die into the empty cavity; and forming a second dielectric material between the first dielectric material and the first die such that the horizontal axis intersects the first and second dielectric materials and the first die. Other embodiments are described herein.

11 Claims, 11 Drawing Sheets

(56) References Cited

U.S. PATENT DOCUMENTS

| | | | | |
|---|---|---|---|---|
| 2005/0048759 A1* | 3/2005 | Hsu | H01L 23/36 | 438/618 |
| 2005/0098891 A1* | 5/2005 | Wakabayashi | H01L 21/568 | 257/758 |
| 2006/0087036 A1* | 4/2006 | Yang | H01L 23/49816 | 257/738 |
| 2006/0237225 A1* | 10/2006 | Kariya | H01L 23/49827 | 174/260 |
| 2007/0096292 A1* | 5/2007 | Machida | H01L 21/4857 | 257/700 |
| 2007/0289127 A1* | 12/2007 | Hurwitz | H01L 21/4857 | 29/827 |
| 2008/0006936 A1* | 1/2008 | Hsu | H01L 23/5389 | 257/731 |
| 2008/0079139 A1* | 4/2008 | Ye | H01L 23/49827 | 257/700 |
| 2011/0090657 A1* | 4/2011 | Yoshino | H01L 23/5389 | 361/762 |
| 2011/0127076 A1* | 6/2011 | Kim | H01L 24/24 | 174/258 |
| 2011/0259630 A1* | 10/2011 | Park | H01L 23/13 | 174/260 |
| 2011/0304999 A1* | 12/2011 | Yu | H01L 23/15 | 361/783 |
| 2012/0161331 A1* | 6/2012 | Gonzalez | H01L 24/19 | 257/774 |
| 2012/0326271 A1* | 12/2012 | Teh | H01L 23/3121 | 257/532 |
| 2013/0277837 A1* | 10/2013 | Teh | H01L 25/50 | 257/737 |
| 2013/0277865 A1* | 10/2013 | Teh | H01L 23/498 | 257/782 |
| 2013/0284572 A1* | 10/2013 | Teh | H01L 25/0657 | 200/283 |
| 2014/0001583 A1* | 1/2014 | Teh | B81B 3/0005 | 257/417 |
| 2014/0048951 A1* | 2/2014 | Lin | H01L 23/481 | 257/774 |
| 2014/0061946 A1* | 3/2014 | Zhao | H01L 24/17 | 257/774 |
| 2014/0093999 A1* | 4/2014 | Teh | H01L 21/568 | 438/107 |
| 2014/0264799 A1* | 9/2014 | Gowda | H01L 23/3677 | 257/675 |
| 2015/0050781 A1* | 2/2015 | Guzek | H01L 21/568 | 438/118 |
| 2015/0084210 A1* | 3/2015 | Chiu | H01L 23/5385 | 257/778 |
| 2015/0262972 A1* | 9/2015 | Katkar | H01L 21/561 | 257/48 |
| 2015/0348956 A1* | 12/2015 | Groothuis | H01L 23/15 | 361/783 |
| 2016/0133613 A1* | 5/2016 | Seo | H01L 25/105 | 257/686 |
| 2016/0155695 A1* | 6/2016 | Shen | H01L 23/315 | 257/676 |
| 2016/0172292 A1* | 6/2016 | Hsu | H01L 23/13 | 257/698 |
| 2016/0204067 A1* | 7/2016 | Chase | H01L 23/5389 | 257/774 |
| 2016/0268182 A1* | 9/2016 | Lee | H01L 23/5384 | |
| 2016/0284644 A1* | 9/2016 | Teh | H01L 21/568 | |
| 2017/0019989 A1* | 1/2017 | Lee | H05K 1/144 | |
| 2017/0243803 A1* | 8/2017 | Lin | H01L 23/13 | |

OTHER PUBLICATIONS

Tao, et al. "Package-on-Package Interconnect for Fan-Out Wafer Level Packages," 13th International Wafer-Level Packaging Conference, 2016, 39 pages.

Brandenburg, Scott, "Overmolded Electronic Assembly Packaging," Solid State Technology, accessed Jun. 2017, 7 pages.

Wikipedia, "Package on package," https://en.wikipedia.org/wiki/Package_on_package, accessed Jun. 2017, 3 pages.

Website, "From Fan-out Wafer to Panel Level Packaging," https://www.izm.fraunhofer.de/en/feature_topics/panel-level-packaging.html, accessed Jun. 2017, 4 pages.

Wikipedia, "Printed circuit board," https://en.wikipedia.org/wiki/Printed_circuit_board, accessed Jun. 2017, 10 pages.

Garrou, et al. "RDL: an integral part of today's advanced packaging technologies," Solid State Technology, accessed Jun. 2017, 7 pages.

Website, "Amkor Technology: Silicon-Less Integrated Module (SLIM(TM))," https://www.amkor.com/go/technology/slim, accessed Jun. 2017, 2 pages.

Website, "Package on Package (PoP | PSfvBGA | PSfcCSP | TMV(r) PoP)," https://www.amkor.com/go/Package-on-Package, accessed Jun. 2017, 5 pages.

Yole Development, "Fan-Out and Embedded Die: Technologies & Market Trends," www.yole.fr, 2015, 29 pages.

* cited by examiner

SEMICONDUCTOR PACKAGE WITH CAVITY

TECHNICAL FIELD

Embodiments of the invention concern electronic packaging.

BACKGROUND

Electronic products come in many forms. Mobile computing nodes, for example, include smart phones, tablet computers, and nodes included in the Internet of Things (IoT), which concerns the inter-networking of physical devices, vehicles (also referred to as "connected devices" and "smart devices"), buildings, and other items embedded with electronics, software, sensors, actuators, and network connectivity which enable these objects to collect and exchange data. Such computing nodes are typically small with pressure to get smaller and smaller. This reduction in physical "real estate" includes the use of thin processors or dies included within thin packages.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

FIG. 2 depicts an embodiment of a package with two cavities for two dice or dies. While FIG. 2 shows two cavities and two die other embodiments may have three or more cavities and dies.

DETAILED DESCRIPTION

Figure 1:
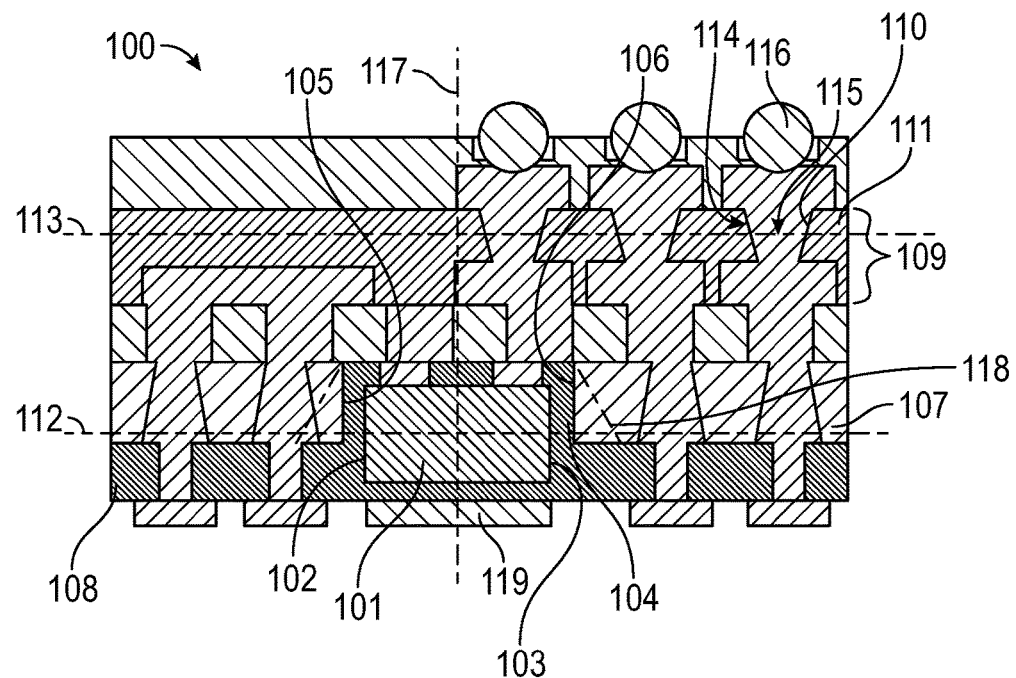
FIG. 1 depicts an embodiment of a package with a cavity for a die.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer (e.g., barrier layer, seed layer, etch stop layer) of a semiconductor device is necessarily shown. Also, interconnects may not align perfectly in the figures and other details may be omitted when the focus of the figure is elsewhere, such as the presence of cavity 204' in FIG. 2 as opposed to the specific layout of interconnects in layer 209. Also, not every step is shown for processes such as processes 300 and 400 in FIGS. 3(A)-(K) and 4. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Applicant recognized certain problems must be overcome in the pursuit for thinner packaging. For example, a key challenge is presented with "fan out" packing systems.

More specifically, Fan-out Wafer Level Packaging (FOWLP) is a packaging technology that promotes package miniaturization. A technological aspect of FOWLP includes the formation of a reconfigured molded wafer combined with a thin film redistribution layer (RDL). FOWLP has improved radio frequency (RF) performance due to its implementation of relatively shorter interconnects together with direct integrated circuit (e.g., printed circuit board) connection by thin film metallization instead of wire bonds or flip chip bumps and lower parasitic effects.

Applicant has determined that many fan-out packaging assembly processes include "die-first" wafer level packaging. This involves taking a "known good die" that has already been tested and then placing the die into the beginning stages of the package. That die is then subjected to heat and stress as the package formation process proceeds. The heat and stress result in the loss of many known good dies, which is a financial detriment to die and package producers. In fact, the risks to the known good die are not limited to heat and stress but more generally include any misprocessing during packaging that will result in the known good die loss as well as loss of the entire package, which has a huge impact on cost.

However, embodiments addressed herein provide a low z-height (measured orthogonal to the main horizontal plane in which the die lays), high density, coreless package architecture using a "die-last" packaging approach (where the known good die is inserted into a cavity of the package much later in the package formation process) thereby reducing the risk of die loss and reducing manufacturing costs. Such embodiments are suitable for Package-on-Package (PoP) and multi-chip packaging systems.

More specifically, one embodiment of the "die-last" approach includes inserting the die relatively late in the process while first level interconnects (through which the die couples to, for example, another package in a PoP system) are made relatively early in the process. The approach uses a releasable material (e.g., a film) that creates a placeholder for a die. This placeholder may take the form of a cavity that includes the sacrificial releasable material. The sacrificial material is included early in the process and then removed later in the process, at which time it is replaced with a known good die.

Figure 4:
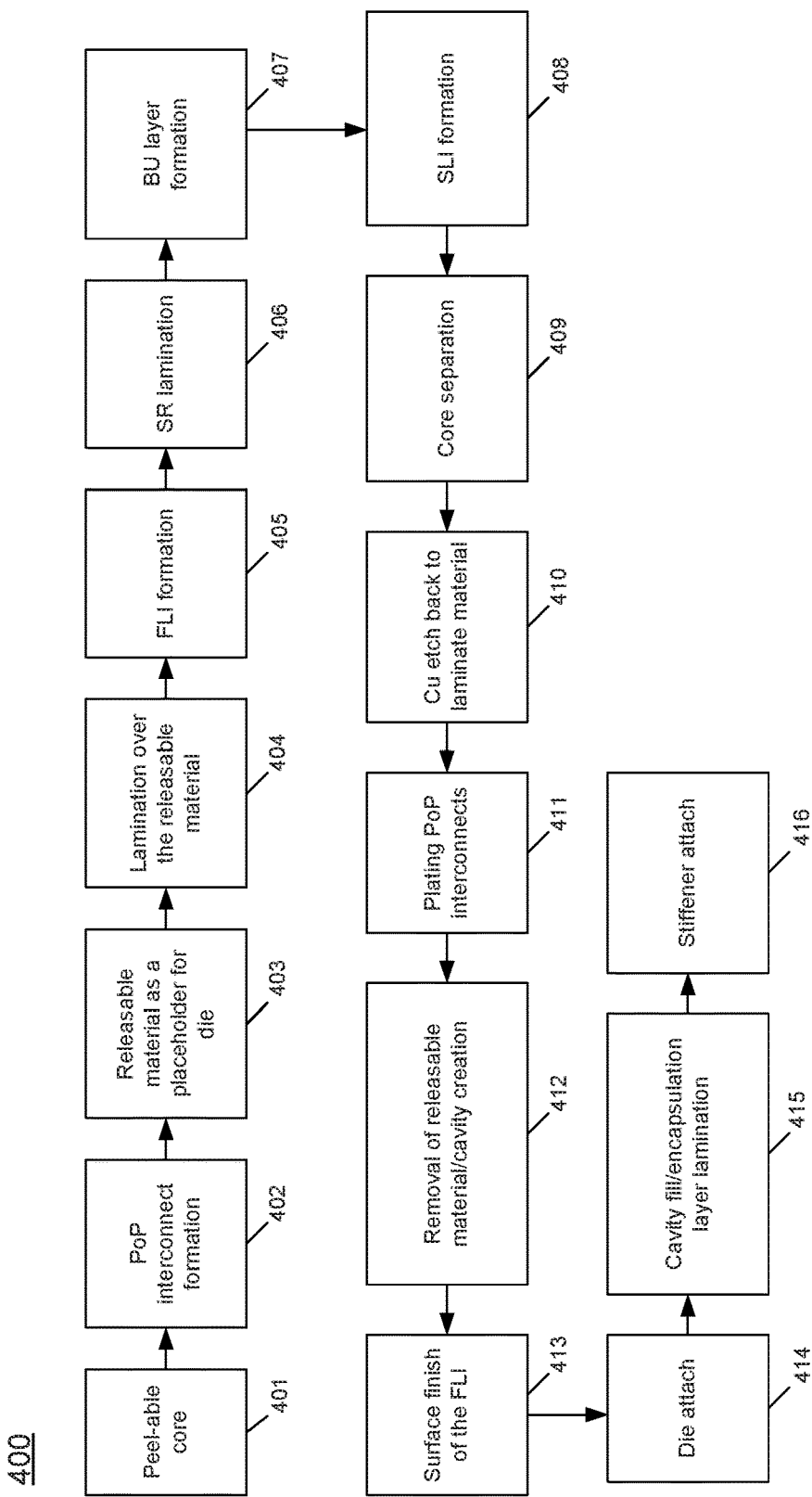
FIG. 4 depicts a method of package formation in an embodiment.

FIGS. 3(A)-(K) depict a method 300 of package formation in an embodiment. FIG. 4 depicts a method 400 of package formation in an embodiment. These figures are now discussed and describe a process flow with peel-able core panels resulting in packaging with a coreless architecture. The processes 300, 400 are not identical to each other and illustrate how certain process steps may be optional and/or how the order of certain operation steps may be varied in different embodiments.

First, a peel-able core panel is provided. Such a panel may include prepreg 350 (fiberglass pre-impregnated with resin) and copper (Cu) 351. (See FIG. 3(A) and FIG. 4, element 401). The core may include a wide range of adhesive-based (inorganic/organic) cores, vacuum-based cores, thermal releasable cores, and the like. In an embodiment this is performed at the panel level, not the wafer level (although in other embodiments it may be performed at the wafer level).

Second, a releasable/sacrificial film 352 is placed on the core using a template, mask, and the like. (See FIG. 3(A) and FIG. 4, element 403). Material 352 acts as a placeholder for the die, which will replace material 352 later in the process. The placeholder material is then laminated over with a dielectric such as, for example, buildup (BU) material (e.g., ABF film), solder resist (SR) material, underfill material, and/or mold film-like material 307 (depending on the warpage requirements of the package) such that material 352 is flush with the placeholder material. (See FIG. 3(B) and FIG. 4, element 404).

At one stage the laminated material 307 can be laser drilled to create a PoP interconnect. This can occur early in the process (e.g., soon after the stage in FIG. 3(B)) or later in the process ((see FIG. 3(H)). The ability to laser drill material 307 and plate the interconnects gives the capability of having a tighter pitch. For instance, the via drill and electroplating processes in substrate manufacturing are mature and can control pitch by modulating process conditions, tool sets, and the like. In fact, the PoP interconnects can be formed before material 307 is applied. (See FIG. 4, element 402). For example, if tighter pitch is needed the PoP interconnects can be plated up on the core and then material 352 can be laminated over the PoP interconnects using, for example, lithographic via processing. Also, the PoP interconnects can be formed after core separation (FIG. 4, 409). See, for example, process 300.

Regarding lithographic via processing, lithographic via processing (LiV) includes a process that helps reduce fine line and spacing as well as pitch between features. This approach relies on plating the required features first and then applying dielectric, instead of drilling thru the dielectric and plating up the vias and copper features. Embodiments that use LiV alignment to contact pads (instead of laser drilled via alignment to contact pad) will have tighter alignment (as opposed to laser drilling) and consequently the pitch is smaller due to a lower alignment budget.

Once material 307 is applied (e.g., laminated) over the releasable film 352, first level interconnects (FLI) 353 are created. (See FIG. 3(C) and FIG. 4, element 405). The FLI can be formed using different techniques varying from electrolytic Cu applications (eCu), thick Ni plating, Sn plating, and the like depending on the platform requirement. Once the FLI are formed, solder resist 354 is flush-laminated using vacuum lamination. (See FIG. 3(D) and FIG. 4, element 406).

Thereon, BU layers are formed using, for example, semi-additive processing, LiV, subtractive etch processes, Laser Directed Imaging (LDI) technique, and the like. (See FIG. 3(E) and FIG. 4, element 407). These processes are repeated depending on the number of BU layers desired. Semi-additive processing may provide a thin layer of copper on a surface. A reverse mask is then applied in some embodiments. Additional copper is then plated onto the surface in unmasked areas. Tin-lead or other surface platings are then applied. The mask is stripped away and a brief etching step removes the now-exposed bare original copper laminate from the surface, isolating the individual interconnects. BU layers include dielectric 311 and interconnects 310. Interconnect 310 may include vias, such as vias that are completely filled with metal (as opposed to vias where the sidewalls are lined with the metal but the via is not completely filled with metal between opposing sidewalls of the via).

Next, second level interconnect (SLI) openings are created in a manner similar to FLI creation. (See FIG. 3(F) and FIG. 4, element 408). SLI openings may be formed at this stage (FIG. 3(F)) or, in other embodiment, may be formed after die attachment and lamination (See FIG. 3(K)).

Then the peel-able core 350 is separated resulting in two symmetrical stack ups of layers. (See FIG. 3(F) and FIG. 4, element 409). After the core is separated, the Cu layers 351 are etched back to the BU layers. (See FIG. 3(G) and FIG. 4, element 410). This exposes the releasable material 352 making it possible to remove the release material. Interconnects (e.g., PoP pads) 355 are then plated to a required target thickness. (See FIGS. 3(H)-(I) and FIG. 4, element 411). This may include first drilling vias within material 307. PoP pads are formed in the case of a package using a PoP architecture. However, in embodiments that use multi-chip packaging where dies are connected on one single package (e.g., FIG. 2) these pads may not be needed. Additionally, depending on the pitch required these pads and interconnects for PoP coupling may include laser drilled vias that are plated (e.g., using SAP) after die embedding and encapsulation (e.g., FIG. 3K) or can be formed by plating up (e.g., LiV) as mentioned above.

After plating the interconnects, the releasable material 352 is removed. (See FIG. 3(J) and FIG. 4, element 412). Different techniques can be used to release the material depending on the characteristics of the material. The release materials 352 may include without limitation: (1) Releasable PET (Poly-Ethylene Terephthalate) that is LASER defined in the beginning (e.g., FIG. 3(A)) and removed at the end of process 300/400 mechanically, (2) Dry Film Resist (DFR) that is patterned/developed into the dimension required and is chemically stripped in the end of the process 300/400 using the DFR strip solution, (3) TEMPLOC® adhesive chemical release material that can be stencil printed and removed in the end of process 300/400 by using hot water that does not impact/etch Cu interconnects, and (4) polyethylene terephthalate (PET) thermal release film.

With the removal of the releasable material 352 a cavity 304 is created into which the die 301 is attached at the substrate panel level (after the surface finish of the FLI pads/bumps). (See FIG. 3(J) and FIG. 4, element 413, 414). The ability to attach the die within the substrate packaging line is another benefit that improves throughput as well as handling. Once the die is attached the cavity is filled using a BU/SR material 308 or any other material needed. For example, with a PoP interface a capillary underfill (CUF) (which may include a film or liquid) and/or mold underfill (MUF) (which may include a film or liquid) may be used. The underfill materials may be used with a vacuum laminator tool. (See FIG. 3(K) and FIG. 4, element 415). Thus, in some embodiments no underfill materials is used but in other embodiments underfill material is used. This essentially eliminates the need for a separate process step of under-filling the die as well as provides the benefit of higher throughput. After the cavity is filled a stiffener 319 is attached ((See FIG. 3(K) and FIG. 4, element 416) and the package with die 301 can be tested for electrical performance and other specifications.

The lamination of BU film or CUF or MUF can be optimized such that a lower level of the material 308 is located off-die versus on-die. As addressed with regard to FIG. 5, this ensures smaller BGA pads may be used and thereby lowers the risk of bridging.

While embodiments described herein have mentioned using a lamination process to apply materials (e.g., dielectric 108) other embodiments are not so limited and may using molding or liquid coating of dielectric materials in lieu of or in addition to lamination.

FIG. 1 depicts an embodiment of a package with a cavity for a die. Specifically, FIG. 1 includes a semiconductor package 100 comprising: a first die 101 including first and second sidewalls 102, 103; a first cavity 104 including first and second sidewalls 105, 106 each comprising a first dielectric material 107. Package 100 further includes a second dielectric material 108 directly contacting the first and second sidewalls of the first die. Package 100 includes a first layer 109, on the first die, which includes a first metal interconnect 110 and a third dielectric material 111. A first horizontal axis 112 intersects the first and second sidewalls 102, 103 of the first die, the first and second sidewalls 105, 106 of the first cavity, and the second dielectric material 108, but does not intersect the first layer 109. A second horizontal axis 113 intersects the first metal interconnect 110 the third dielectric material 111.

In an embodiment, the first dielectric material 107 directly contacts the second dielectric material 108 along a seam and the first horizontal axis 112 intersects the first seam. For example, the first and second dielectric materials are not monolithic (formed or composed of material without joints or seams) with each other. As will be addressed in FIG. 4 below, the first and second dielectric materials are not formed at the same time and include a seam or junction between the two materials that is not removed in the final product. This seam may be sidewalls 105, 106 when the first and second dielectric materials 107, 108 directly contact each other.

In an embodiment a first vertical axis 117 intersects the first layer 109 and the first die 101. In one embodiment the first and second sidewalls of the first cavity 105, 106 are substantially parallel to the first vertical axis. However, in another embodiment the first and second sidewalls of the first cavity are: (a) not parallel to the first vertical axis, (b) not parallel to the first horizontal axis, and (c) tapered. For instance, in embodiments where the cavity 104 is drilled (e.g., laser drilled or otherwise) the sidewalls of the cavity may be tapered, such as along phantom lines 118. Thus, when the first and second dielectric materials directly contact each other and the sidewalls of the cavity are tapered then so too will the seam be tapered.

In an embodiment the first vertical axis 117 intersects the second dielectric material 108. In one specific example, the second dielectric material 108 directly contacts the first die 101 at a location between the first die 101 and the first layer 109. In such a case the second dielectric material 108 may serve as underfill to die 101 and provide support to die 101 and thereby prevent warping of die 101. In addition, a stiffener 119 may be coupled to die 101 in some embodiments to prevent warping of die 101.

In an embodiment the first and second dielectric materials include different material compositions from each other. For example, first dielectric material 107 may include a molding compound (e.g., thermoset epoxy) or solder resist while second dielectric material 108 includes an underfill material (e.g., an underfill encapsulant such as an epoxy). The materials may include differing fillers, such as one dielectric material including silica particles while another dielectric material includes filler particles made from a different material. However, in other embodiments the first and second dielectric materials have substantially equal material compositions to one another. In an embodiment the third dielectric material 111 has a substantially equal material composition to that of at least one of the first and second dielectric materials. However, in other embodiments the third dielectric material 111 does not have a substantially equal material composition to that of either of the first and second dielectric materials.

In an embodiment the first metal interconnect 110 includes a via that is completely filled with at least one metal. This is in contrast to, for example, a technology whereby only a sidewall 114 of via 110 is plated but the middle 115 of via 110 does not include a metal conductor. Instead, in an embodiment the via is "solid" and includes one or more metals along with sidewall 114 and its middle 115.

In an embodiment layer 109 constitutes a redistribution layer (RDL). The lack of area array for die 101 may be addressed by redistributing metal interconnects to input/out (I/O) nodes on the die. RDLs include metal and dielectric layers (e.g., on a surface of a wafer or die) to re-route the I/O layout of the die into a looser pitch footprint. Such RDLs may include thin film polymers (B-staged bisbenzocyclobutene (BCB), polyimide (PI), Asahi Glass ALX, epoxy based polymers, and the like) for dielectric 111 and metallization (Al or Cu) for traces and vias 110 to reroute peripheral pads to an area array configuration.

An embodiment comprises at least one solder ball 116, wherein the first layer 109 is between the at least one solder ball 116 and the first die 101. The solder ball may be used to connect to other circuits such as those included on a circuit board coupled to package 100.

The embodiment of FIG. 1 is a coreless package with no silicon core. Further, with no silicon core there are no through silicon vias (TSV) included in such a core. Further, there are no TSVs in the first die for embodiments such as package 100 which has a fan out architecture. While a silicon core is addressed above, the core does not necessarily have to be a silicon core. For example, the core may include prepreg impregnated with glass cloth. Thus, embodiments include organic polymer based composite laminates and the like. Some cored embodiments may require "through holes" while coreless embodiments include no through holes to connect FLI to SLI.

Figure 2:
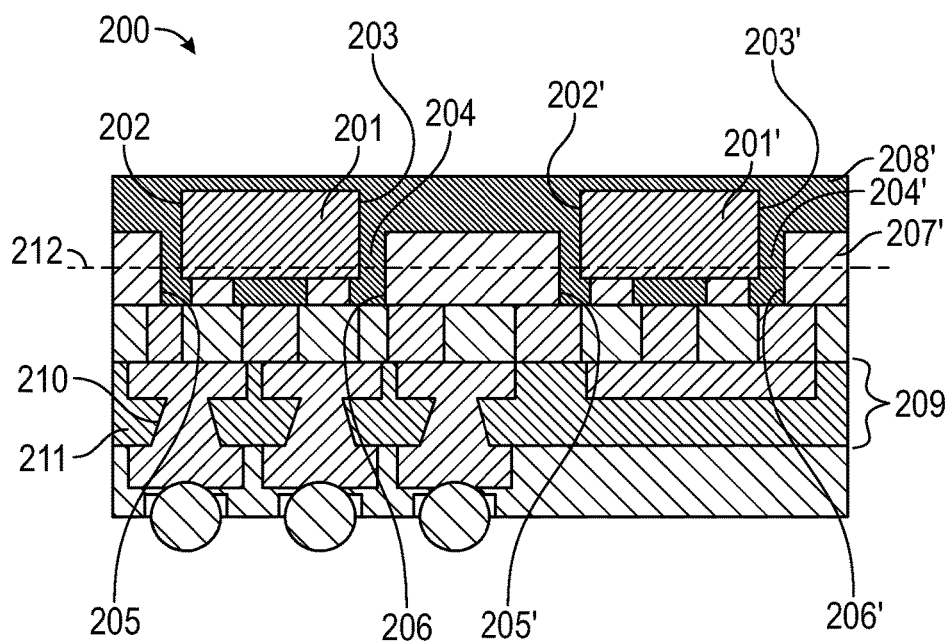
Figure 3A:
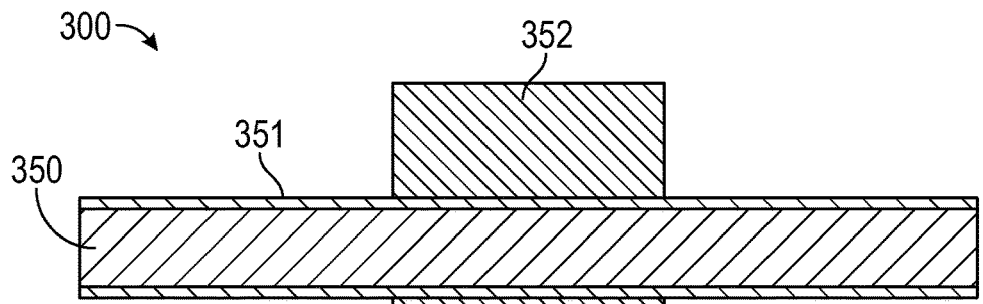
FIGS. 3(A)-(K) depict a method of package formation in an embodiment.
Figure 3B:
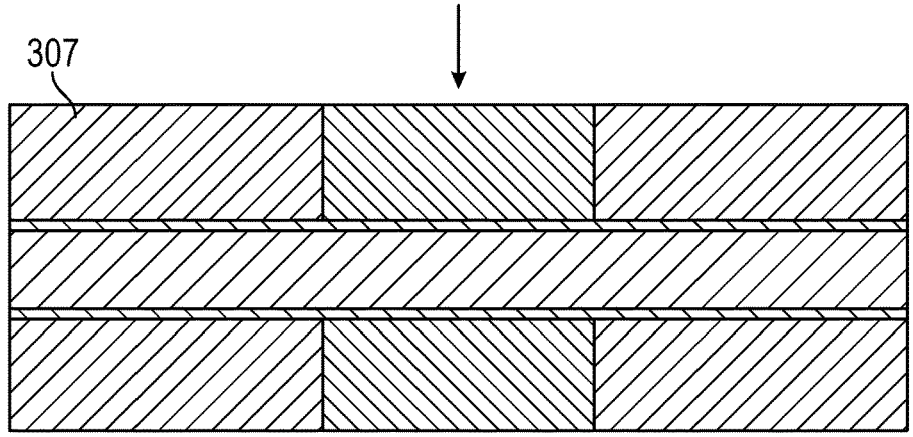
Figure 3C:
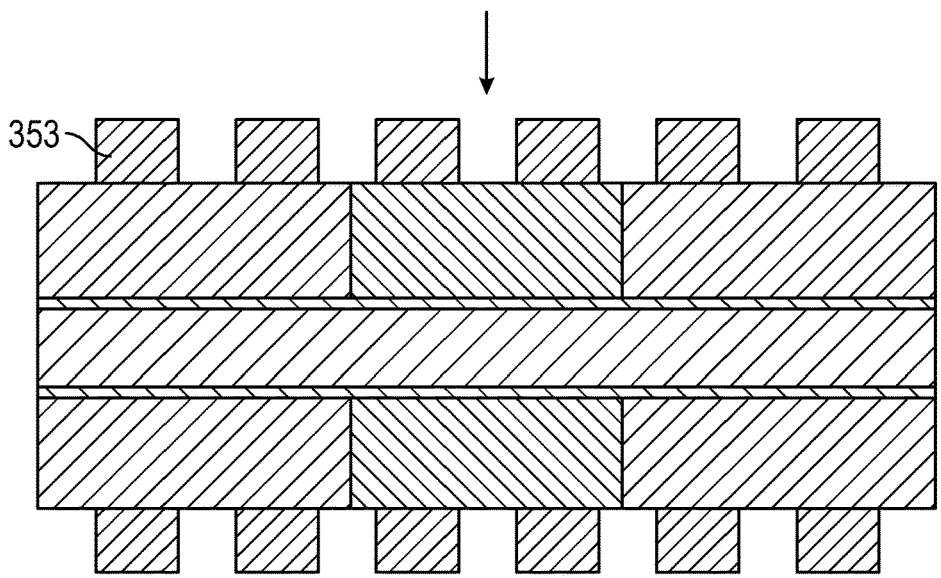
Figure 3D:
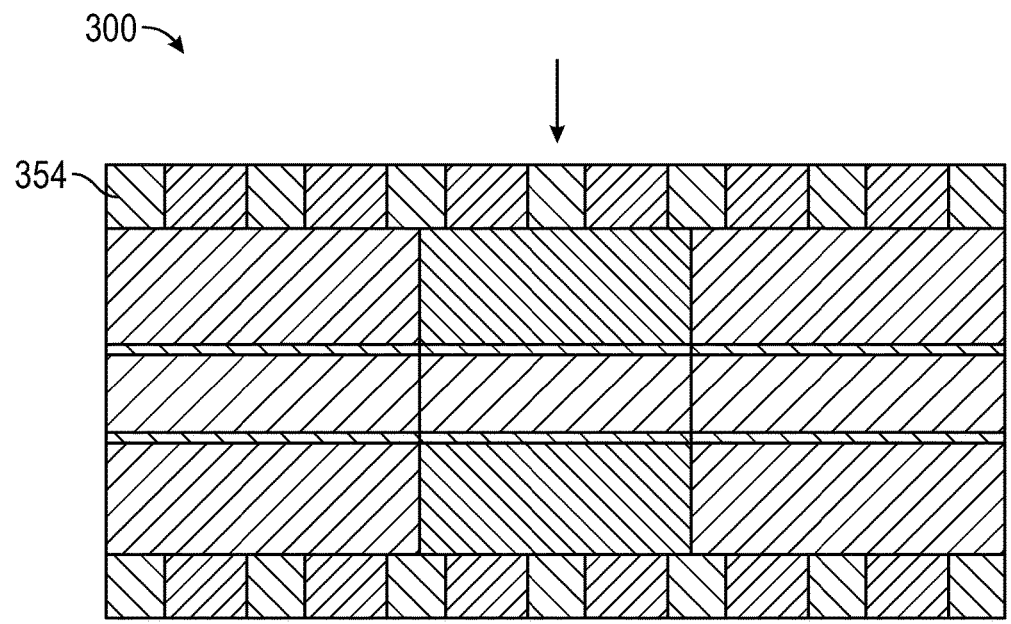
Figure 3E:
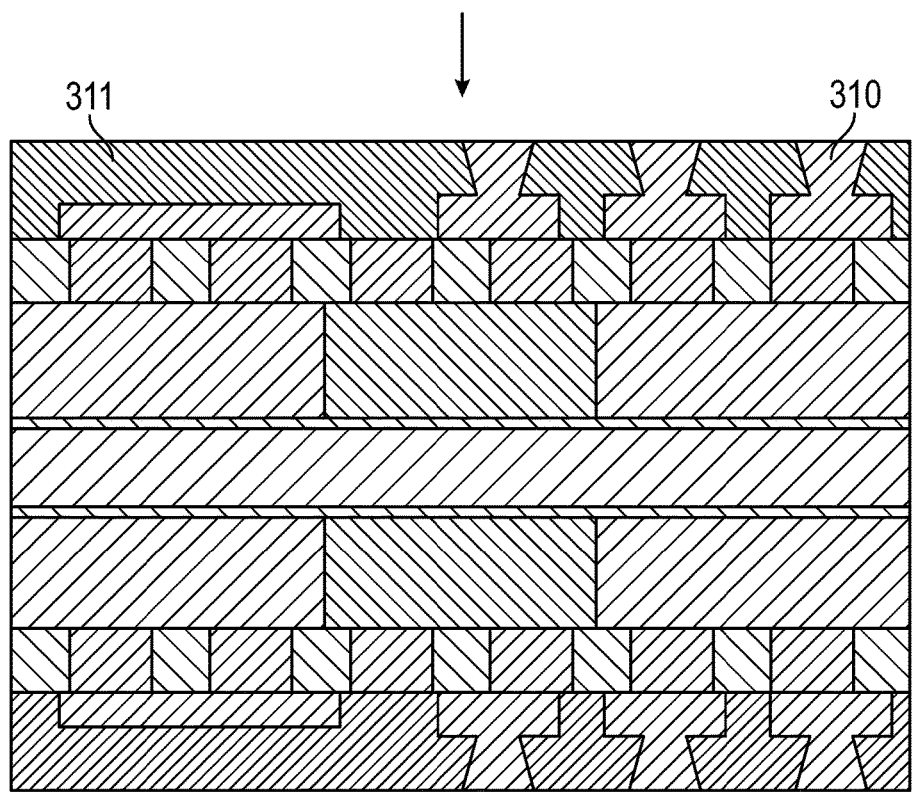
Figure 3F:
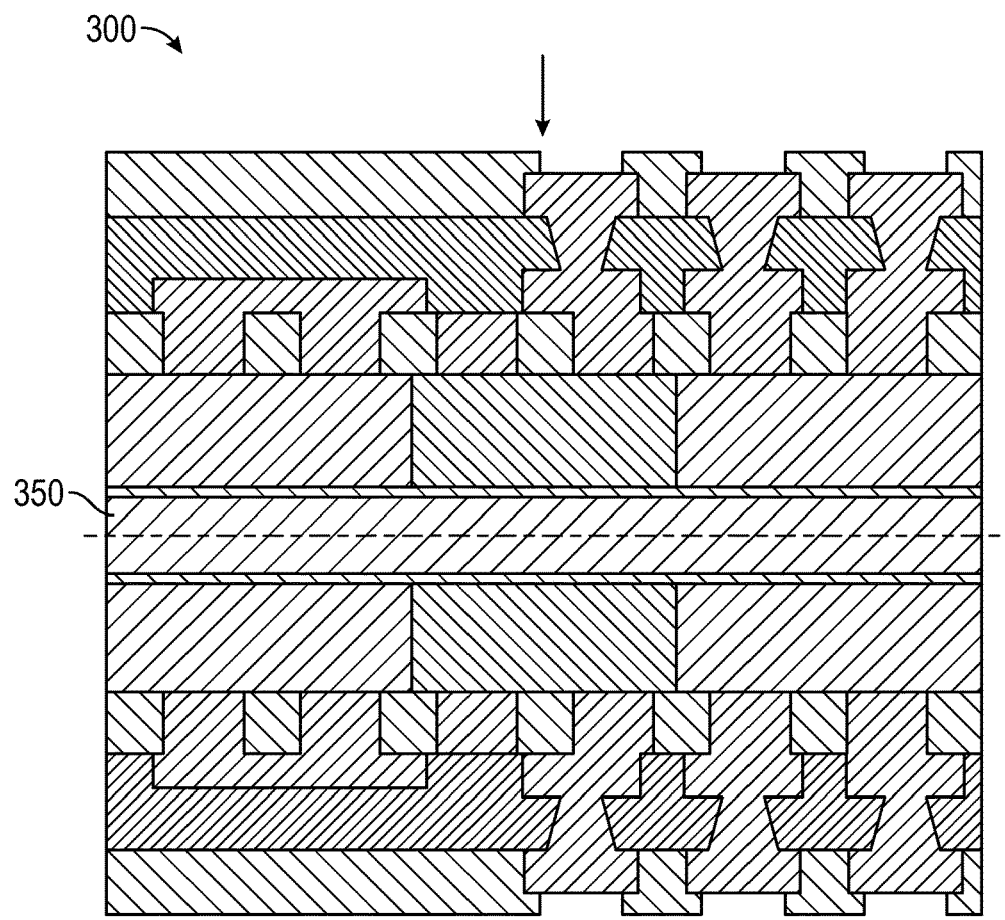
Figure 3G:
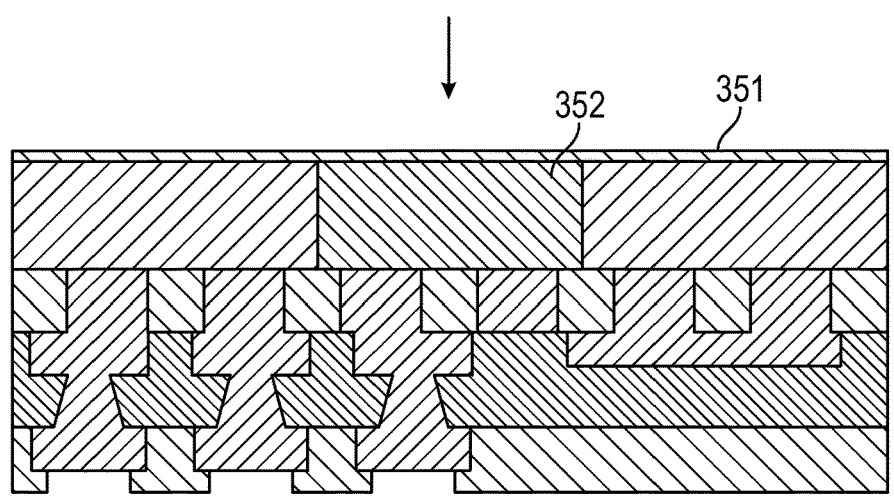
Figure 3H:
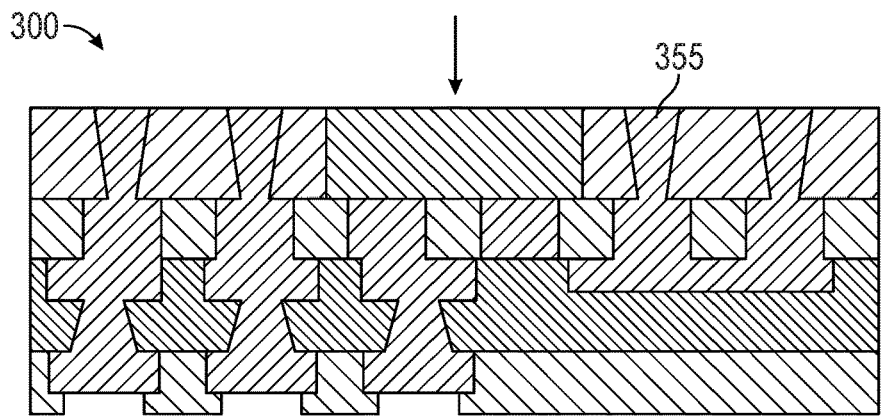
Figure 3I:
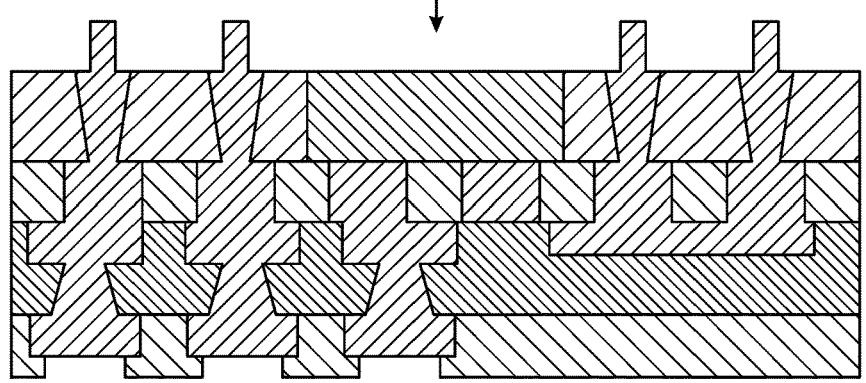
Figure 3J:
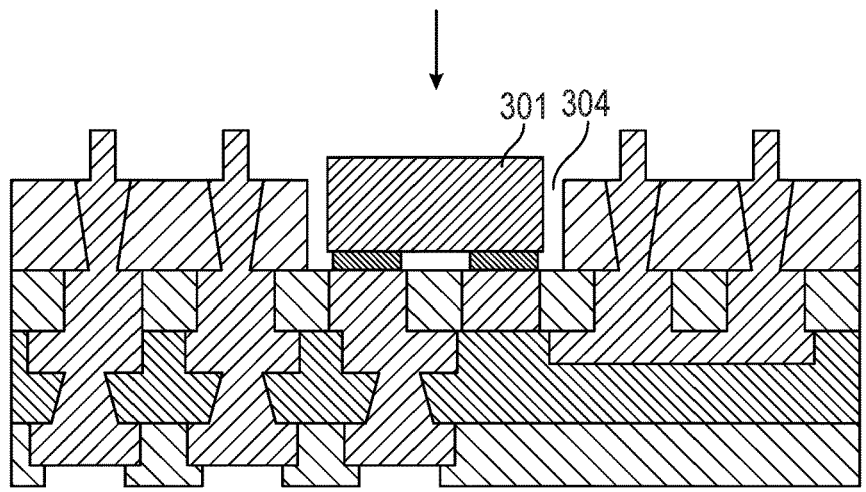
Figure 3K:
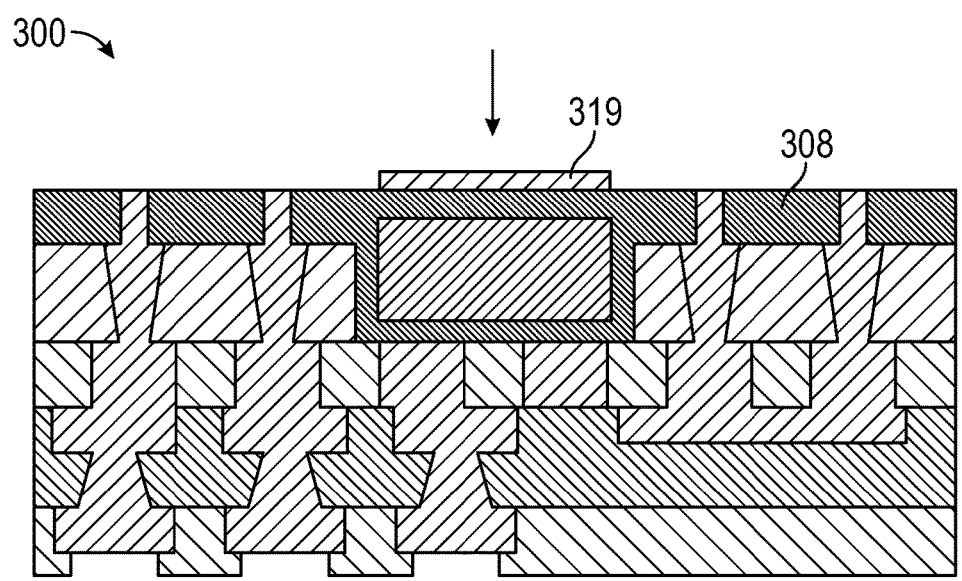

FIG. 2 depicts an embodiment of a package with two cavities for two dies. While FIG. 2 shows two die other embodiments may include three or more die. Specifically, FIG. 2 includes a semiconductor package 200 comprising: a first die 201 including first and second sidewalls 202, 203; a first cavity 204 including first and second sidewalls 205, 206 each comprising a first dielectric material 207'. Package 200 further includes a second dielectric material 208' directly contacting the first and second sidewalls of the first die 201. Package 200 includes a first layer 209, on the first die, which includes a first metal interconnect 210 and a third dielectric material 211. A first horizontal axis 212 intersects the first and second sidewalls 202, 203 of the first die, the first and second sidewalls 205, 206 of the first cavity, and the second dielectric material 208', but does not intersect the first layer 209.

Package 200 further comprises a second die 201', wherein the first horizontal axis 212 intersects the first and second dies. Package 200 further includes a second cavity 204' including first and second sidewalls 205', 206' each comprising the first dielectric material 207'. The second dielectric material 208' directly contacts the first and second sidewalls 202', 203' of the second die. The first layer 209 is on the second die 201'. The first horizontal axis 212 intersects the first and second sidewalls 202', 203' of the second die, and the first and second sidewalls 205', 206' of the second cavity.

Figure 5:
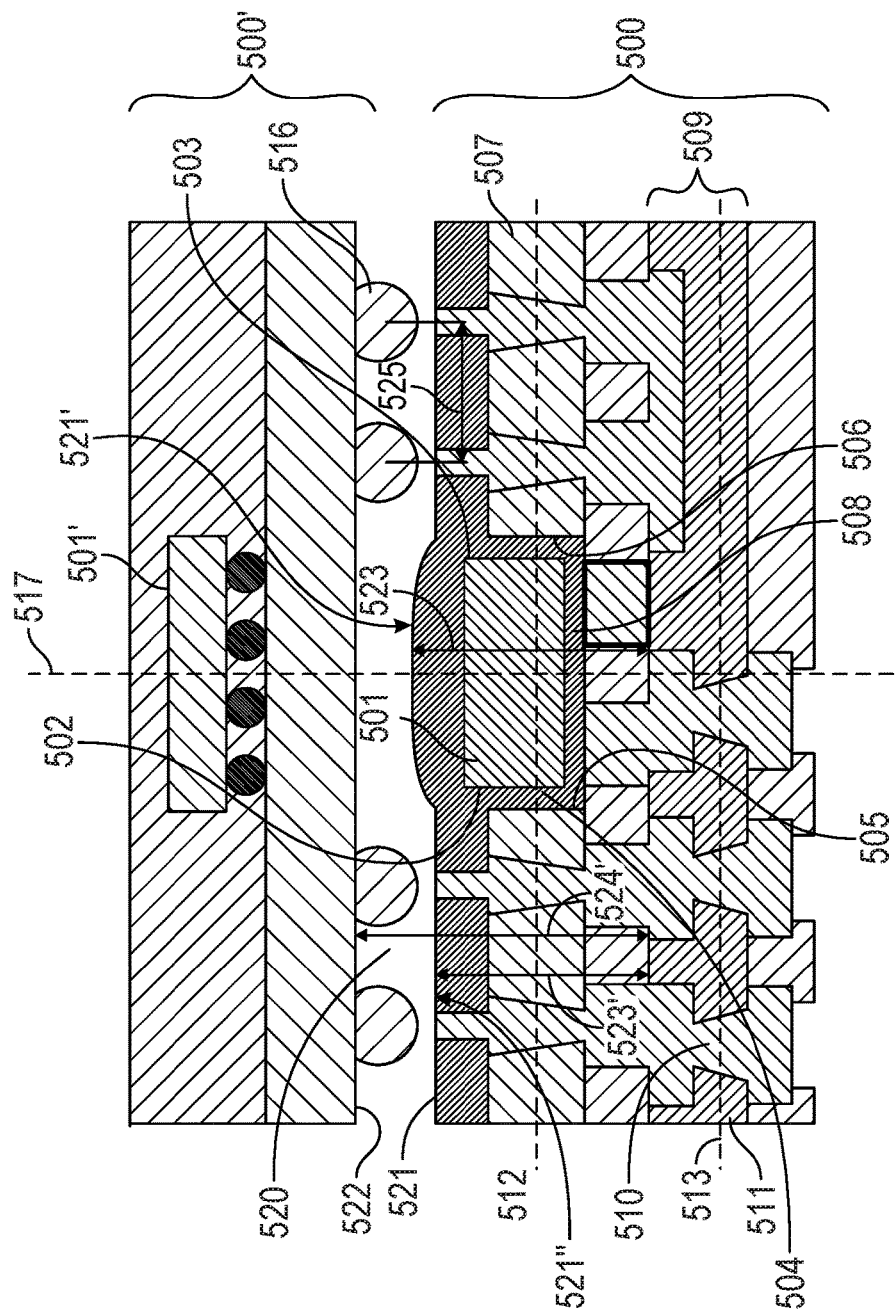
FIG. 5 depicts a package-on-package (PoP) system in an embodiment.

FIG. 5 depicts a package-on-package (PoP) system in an embodiment. FIG. 5 includes a semiconductor package system comprising: a first package 500 including: (a)(i) a first die 501 including first and second sidewalls 502, 503, (a)(ii) a first cavity 504 including first and second sidewalls 505, 506 each comprising a first dielectric material 507; (a)(iii) a second dielectric material 508 directly contacting the first and second sidewalls of the first die; (a)(iv) a first layer 509, on the first die, which includes a first metal interconnect 510 and a third dielectric material 511. The system further includes a second package 500' including a second die 501'. A first horizontal axis 512 intersects the first and second sidewalls 502, 503 of the first die, the first and second sidewalls 505, 506 of the first cavity, and the second dielectric material 508, but does not intersect the first layer and does not intersect the second die. A second horizontal axis 513 intersects the first metal interconnect 510 and the third dielectric material 511. A vertical axis 517 intersects the first and second dies. The system comprises at least one solder ball 516 that couples the first die to the second die.

An embodiment of the system includes a void 520 between the first and second dies 500, 500'. The void may include space, underfill material, or some other material (i.e., is not necessarily empty). The void has a lower boundary defined at least in part by an upper surface 521 of the first package and an opposing second boundary defined at least in part by a lower surface 522 of the second package. A portion 521' of the upper surface of the first package directly over the first die is a first distance 523 away from the first layer. A second portion 521" of the upper surface of the first package that is not directly over the first die is a second distance 523' away from the first layer. In an embodiment the first distance is greater than the second distance. For example, dielectric material 508 may be coupled (e.g., a laminate that is applied under vacuum conditions) to die 501 and dielectric 507 in uneven levels. Doing so decreases distance 524'. As a result ball 516 may be decreased in diameter, which not only decreases distance 524' but also decreases pitch 525.

In an embodiment the first vertical axis 517 intersects the first portion 521' of the upper surface of the first package. The first vertical axis does not intersect the second portion 521" of the upper surface of the first package.

In an embodiment the first die 501 includes a processor and the second die 501' includes a memory. However, other embodiments are not so limited may generally include first and second die without limitation to the functions of those die.

An embodiment includes a method comprising: coupling a sacrificial material to a substrate (see, e.g., block 403 of FIG. 4); forming a first dielectric material adjacent the sacrificial material such that a horizontal axis intersects the first dielectric material and the sacrificial material (see, e.g., block 404 of FIG. 4); forming a first layer, on the first dielectric material and the sacrificial material, which includes a first metal interconnect and a third dielectric material (see, e.g., block 407 of FIG. 4); decoupling the substrate from the first dielectric material and the sacrificial material (see, e.g., block 409 of FIG. 4); removing the sacrificial material to form an empty cavity with sidewalls comprising the first dielectric material (see, e.g., block 412 of FIG. 4); after removing the sacrificial material to form the empty cavity, inserting a first die into the empty cavity (see, e.g., block 414 of FIG. 4); and forming a second dielectric material between the first dielectric material and the first die such that the horizontal axis intersects the first and second dielectric materials and the first die (see, e.g., block 415 of FIG. 4).

An embodiment of the above method includes forming an interconnect through the first dielectric material (see, e.g., block 402 of FIG. 4), wherein a first vertical axis intersects the interconnect but does not intersect the first die after the first die is inserted into the empty cavity.

An embodiment includes forming the interconnect through the first dielectric before decoupling the substrate from the first dielectric material and the sacrificial material. However, another embodiment includes forming the interconnect through the first dielectric after decoupling the substrate from the first dielectric material and the sacrificial material.

Embodiments described herein provide many advantages, some of which are addressed below.

First, embodiments provide a lower risk of die loss. Embodiments involve a die-last approach which reduces the risk of "known-good" die loss during packaging as opposed to architectures involving die-first processes. As used herein, a "die last" does not literally mean the die must be included in the absolute last step of package processing.

Second, embodiments provide a lower cost. Embodiments are cheaper than conventional approaches that occur on a wafer level. Embodiments that allow for processing on a panel level (which is larger than a wafer) allow for greater throughput in the packing process. The ability to process the packages on panel level (vs. a wafer level) are evidenced by, for example, fully filled via interconnects in the RDLs as well as the cavity surrounding the die. Further, lower costs are achieved because the die-last approach does not require as many carriers for the die as compared to die-first approaches. This saves processing time. Also, since some embodiments encapsulate the die through lamination on a panel level the lamination eliminates the need of an extra step of over-molding and under-filling the die on a unit level, which again saves processing time and materials which lowers overall cost for the package.

Third, embodiments provide a relatively simpler process. Since over-molding and under-filling are eliminated in some embodiments (while other embodiments may still use underfill) the resultant process is simpler than processes that use over-molding and/or under-filling. The simpler processes consequently have fewer issues such as voids in the underfill material and the like—problems which plague the industry today. This is because lamination (of the first dielectric material 107 and/or second dielectric material 108) on a panel level can attain higher vacuum levels (which is required for many lamination techniques) making the lamination process more reliable and repeatable.

Fourth, embodiments provide for higher output/scalability. For instance, because some embodiments provide a symmetrical build up on a panel level the number of units per substrate output is higher than a conventional wafer level process which is single sided (see, e.g., the symmetric buildup in FIG. 3(F)).

Fifth, embodiments have lower bump bridging risk. Through lamination (used in some embodiments but not all embodiments) of the dielectric material the thickness of the dielectric material can be better controlled. The thickness on-die (e.g., portion 521' of FIG. 5) vs. off-die (e.g., portion 521" of FIG. 5) can be controlled in a way that off-die thickness is lower (e.g., see non-planar surface 521 of FIG. 5), which enables reducing the size of the upper die (e.g., memory die) interconnects (e.g., ball grid array (BGA)) and hence reduces the risk of bridging between such interconnects.

Sixth, embodiments provide for a tighter/smaller PoP pitch. PoP pitch can be reduced given the process capability of via drilling through dielectric and plating (e.g., see FIG. 3(H)).

Seventh, embodiments provide warpage control. With conventional over-mold architecture it is challenging to reduce high temperature warpage without impacting room temperature warpage for the package. However, embodiments are capable of providing the necessary warpage benefit at room temperature and high temperature using BU dielectrics that act as an adhesive to a stiffener (e.g., Cu or stainless steel stiffener). Conventional systems need another adhesive for the stiffener and the adhesive contributes to warpage due to its coefficient of thermal expansion (CTE) mismatch with other components in the package.

Eighth, embodiments provide advantages with regard to die shift. Embodiments that include a cavity prevent or at least limit shifting of the die. This addresses a problem encountered with conventional technologies where a die is overmolded and, as a result, the die shifts from its intended position during overmolding and subsequent curing.

Figure 6:
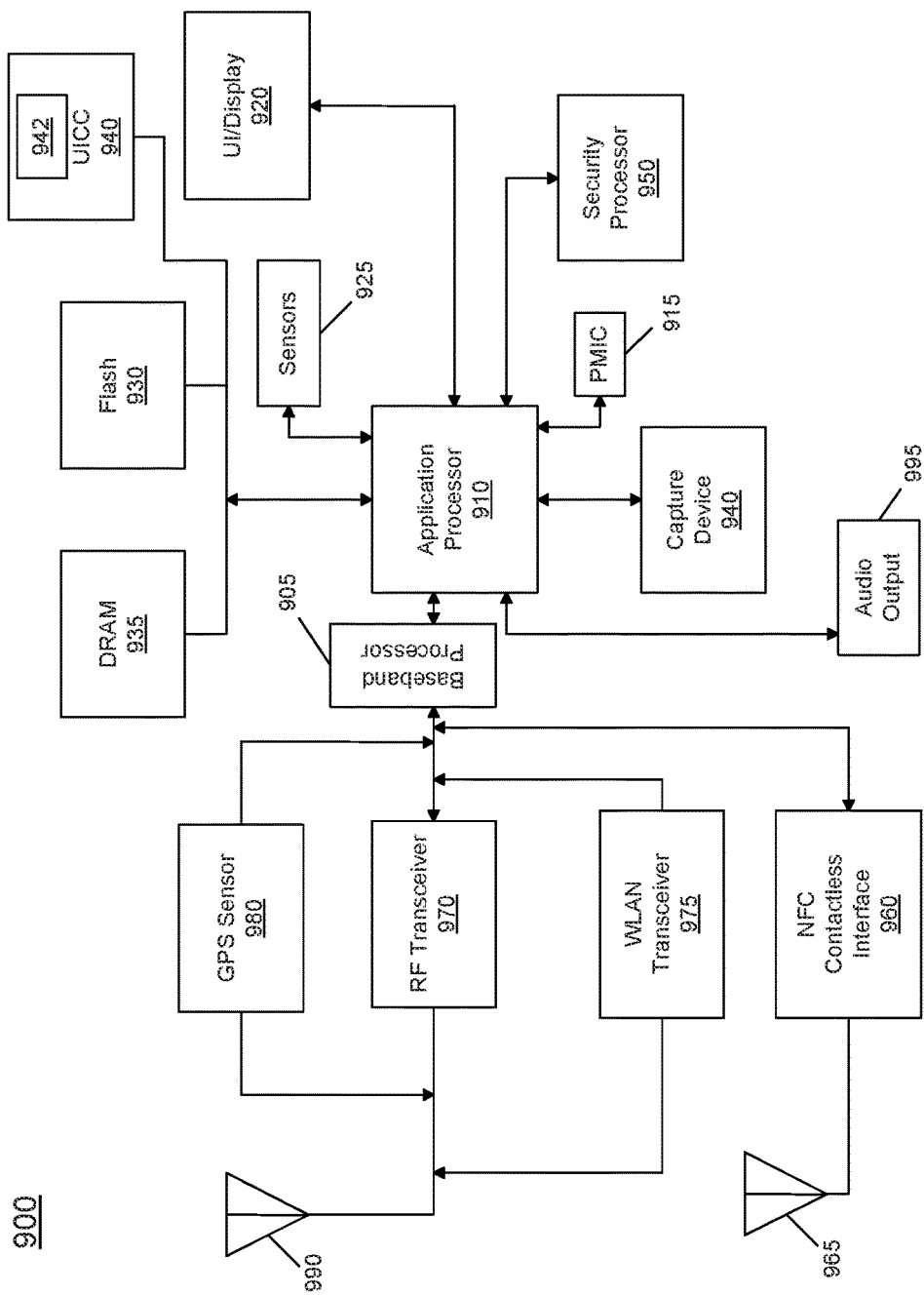
FIGS. 6, 7, and 8 include systems that incorporate embodiments.

Referring now to FIG. 6, shown is a block diagram of an example system with which embodiments can be used. As seen, system 900 may be a smartphone or other wireless communicator or Internet of Things (IoT) device. A baseband processor 905 (which may include the packaging system of embodiments described herein) is configured to perform various signal processing with regard to communication signals to be transmitted from or received by the system. In turn, baseband processor 905 is coupled to an application processor 910 (which may include the packaging system of embodiments described herein), which may be a main CPU of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display). In addition, application processor 910 may couple to a memory system including a non-volatile memory, namely a flash memory 930 and a system memory, namely a DRAM 935. In some embodiments, flash memory 930 (which may be included in a packaging embodiment described herein) may include a secure portion 932 in which secrets and other sensitive information may be stored. As further seen, application processor 910 also couples to a capture device 945 such as one or more image capture devices that can record video and/or still images.

A universal integrated circuit card (UICC) 940 comprises a subscriber identity module, which in some embodiments includes a secure storage 942 to store secure user information. System 900 may further include a security processor 950 (e.g., Trusted Platform Module (TPM)) (which may include the thermal management of embodiments described herein) that may couple to application processor 910. A plurality of sensors 925, including one or more multi-axis accelerometers may couple to application processor 910 to enable input of a variety of sensed information such as motion and other environmental information. In addition, one or more authentication devices 995 may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 (which may include the thermal management of embodiments described herein) couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more IoT networks, various circuitry may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 7:
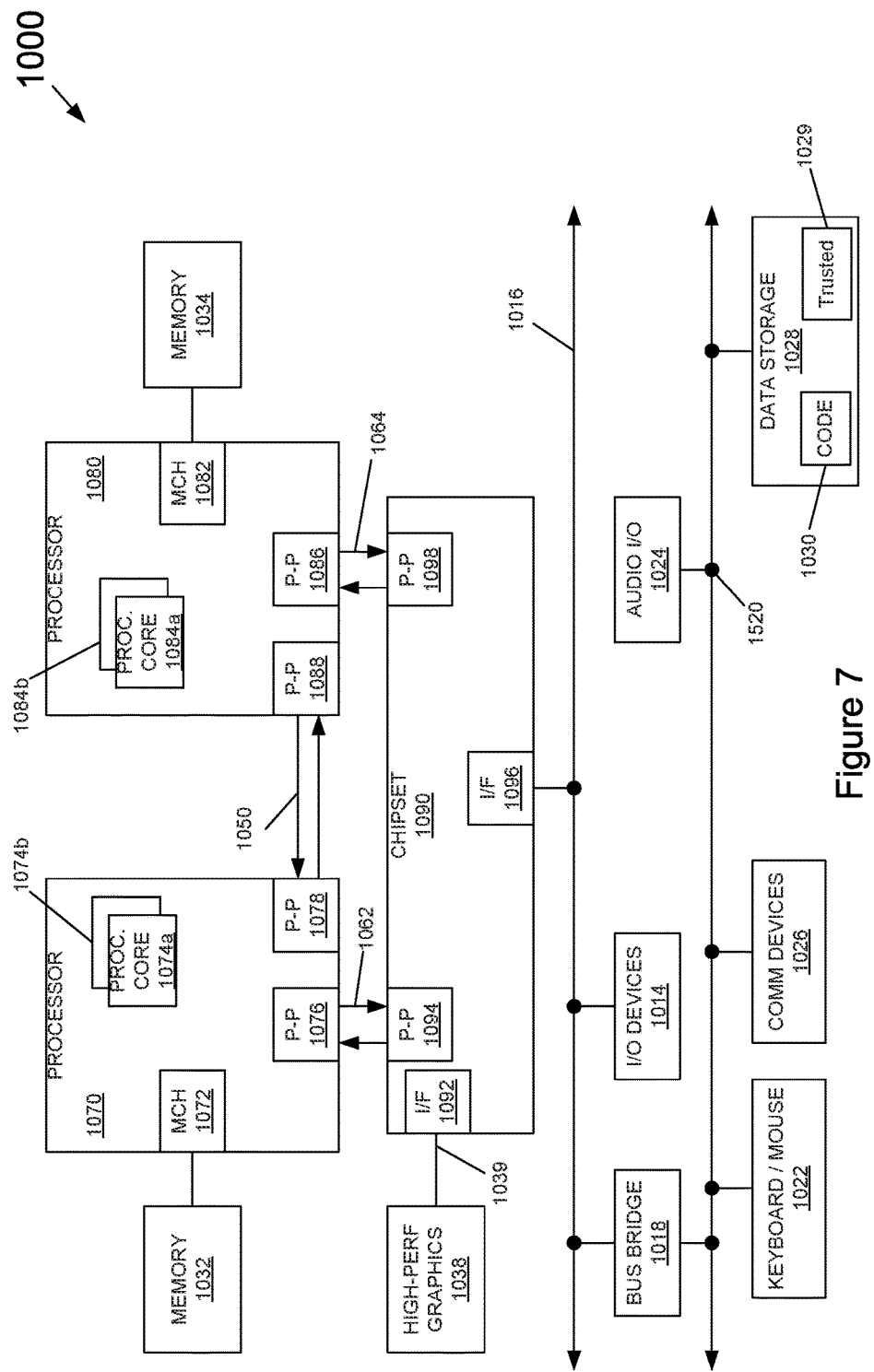

Referring now to FIG. 7, shown is a block diagram of a system in accordance with another embodiment of the present invention. Multiprocessor system 1000 is a point-to-point interconnect system such as a server system, and includes a first processor 1070 (which may include the packaging system of embodiments described herein) and a second processor 1080 (which may include the packaging system of embodiments described herein) coupled via a point-to-point interconnect 1050. Each of processors 1070 and 1080 may be multicore processors such as SoCs, including first and second processor cores (i.e., processor cores 1074*a* and 1074*b* and processor cores 1084*a* and 1084*b*), although potentially many more cores may be present in the processors. In addition, processors 1070 and 1080 each may include a secure engine 1075 and 1085 to perform security operations such as attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034, which may be portions of main memory (e.g., a DRAM) locally attached to the respective processors (memory and processors may be included in packaging embodiments described herein). First processor 1070 and second processor 1080 may be coupled to a chipset 1090 via P-P interconnects 1052 and 1054, respectively. Chipset 1090 includes P-P interfaces 1094 and 1098.

Furthermore, chipset 1090 (which may include the packaging system of embodiments described herein) includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 such as a non-volatile storage or other mass storage device. As seen, data storage unit 1028 may include code 1030, in one embodiment. As further seen, data storage unit 1028 also includes a trusted storage 1029 to store sensitive information to be protected. Further, an audio I/O 1024 may be coupled to second bus 1020.

Figure 8:
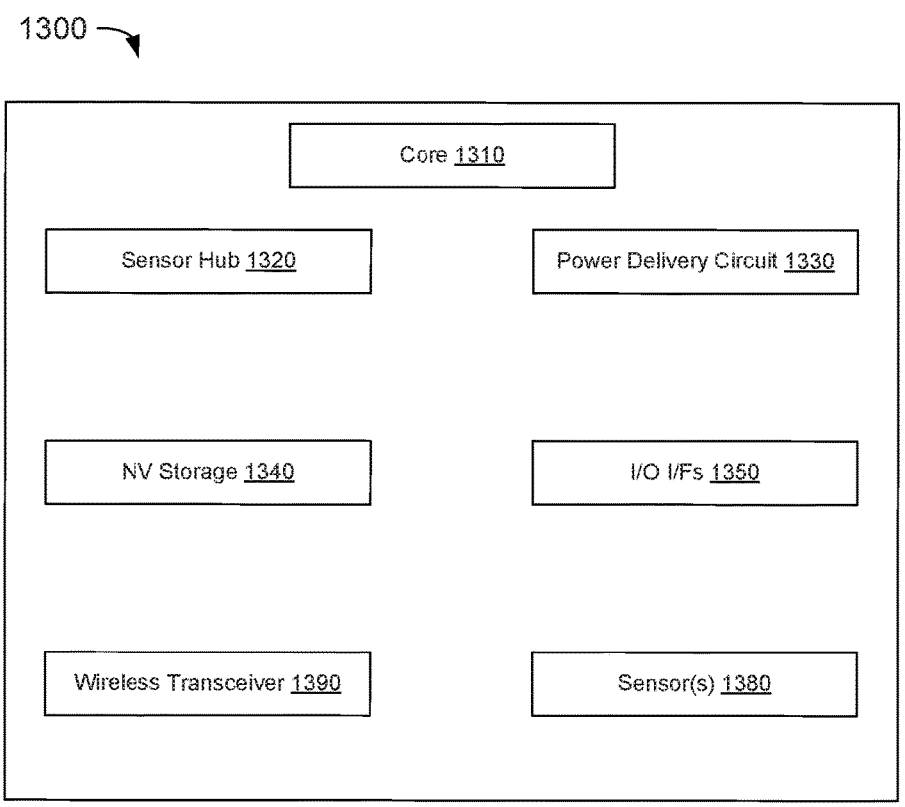

Embodiments may be used in environments where IoT devices may include wearable devices or other small form factor Internet of Things (IoT) devices. Referring now to FIG. 8, shown is a block diagram of a wearable module 1300 in accordance with another embodiment. In one particular implementation, module 1300 may be an Intel® Curie™ module that includes multiple components adapted within a single small module that can be implemented as all or part of a wearable device. As seen, module 1300 includes a core 1310 (which may include the packaging system of embodiments described herein). Such core may be a relatively low complexity in-order core, such as based on an Intel Architecture® Quark™ design. In some embodiments, core 1310 may implement a TEE as described herein. Core 1310 couples to various components including a sensor hub 1320, which may be configured to interact with a plurality of sensors 1380, such as one or more biometric, motion environmental or other sensors. A power delivery circuit 1330 is present, along with a non-volatile storage 1340 (which may include the packaging system of embodiments described herein). In an embodiment, this circuit may include a rechargeable battery and a recharging circuit, which may in one embodiment receives charging power wirelessly. One or more input/output (IO) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. Understand that in different implementations a wearable module can take many other forms. Wearable and/or IoT devices have, in comparison with a typical general purpose CPU or a GPU, a small form factor, low power requirements, limited instruction sets, relatively slow computation throughput, or any of the above.

The following examples pertain to further embodiments.

Example 1 includes a semiconductor package comprising: a first die including first and second sidewalls; a first cavity including first and second sidewalls each comprising a first dielectric material; a second dielectric material directly contacting the first and second sidewalls of the first die; a first layer, on the first die, which includes a first metal interconnect and a third dielectric material; wherein (a) a first horizontal axis intersects the first and second sidewalls of the first die, the first and second sidewalls of the first cavity, and the second dielectric material, but does not intersect the first layer, and (b) a second horizontal axis intersects the first metal interconnect the third dielectric material.

The presence of the cavity may be indicative that the package was formed (e.g., process 300) at the panel level and not at the small wafer level.

In embodiments the dielectric material may include compositions of various materials. A first dielectric may include $A_xB_{1-x}$ and another may include $A_xB_{1-y}$ where x is not equal to y. While the above example refers to first and second dielectric materials this does not prohibit third, fourth, or more dielectrics.

Example 2 includes the package of example 1 wherein the first dielectric material directly contacts the second dielectric material along a seam and the first horizontal axis intersects the first seam.

Example 3 includes the package of example 2 wherein the first and second dielectric materials include different material compositions from each other.

For example, dielectric materials may include polyimide and/or poly (butyl acrylate) (PBA). This is in contrast to conventional technologies that may use epoxy based materials (e.g., ABF).

Example 4 includes the package of example 2 wherein the first and second dielectric materials have substantially equal material compositions to one another.

Example 5 includes the package of example 2 wherein the first metal interconnect includes a via that is completely filled with at least one metal.

This may be indicative that the package was formed (e.g., process 300) at the panel level and not at the small wafer level. This metal interconnect may be part of a RDL. The RDL may be formed of a thin film. A thin film is a layer of material ranging from fractions of a nanometer (monolayer) to several micrometers in thickness. The films may be formed using, for example, deposition techniques such as chemical vapor deposition (CVD), atomic layer deposition (ALD), and physical vapor deposition (PVD).

Also, for tighter pitch and finer line/space a LiV process may be used. A LiV process may provide a via that is has a shape that is less tapered. This in contrast to conventional technologies that use a semi additive process to form vias that are shaped as truncated cones. Additionally, interconnects formed in conventional wafer level RDLs are conformal plated unlike a fully plated VIA in substrate.

Example 6 includes the package of example 5 comprising at least one solder ball, wherein the first layer is between the at least one solder ball and the first die.

Example 7 includes the package of example 5 wherein a first vertical axis intersects the first layer and the first die.

Example 8 includes the package of example 7 wherein the first and second sidewalls of the first cavity are substantially parallel to the first vertical axis.

Example 9 includes the package of example 7 wherein the first and second sidewalls of the first cavity are: (a) not parallel to the first vertical axis, (b) not parallel to the first horizontal axis, and (c) tapered.

Example 10 includes the package of example 7 wherein the first vertical axis intersects the second dielectric material.

Example 11 includes the package of example 10 wherein the second dielectric material directly contacts the first die at a location between the first die and the first layer.

Example 12 includes the package of example 2 wherein the second dielectric material directly contacts the first die at a location between the first die and the first layer.

Example 13 includes the package of example 2 wherein the first and second dielectric materials are not monolithic with each other.

Example 14 includes the package of example 2 comprising a second die, wherein the first horizontal axis intersects the first and second dies.

Example 15 includes the package of example 14 comprising: a second cavity including first and second sidewalls each comprising the first dielectric material; the second dielectric material directly contacting the first and second sidewalls of the second die; and the first layer on the second die; wherein the first horizontal axis intersects the first and second sidewalls of the second die, and the first and second sidewalls of the second cavity.

Example 16 includes the package of example 2 wherein the package does not include a through silicon via (TSV).

For instance, the package may be coreless and may use fan-out traces to avoid the need for placing a TSV within a die.

Example 17 includes a semiconductor package system comprising: a first package including: (a)(i) a first die including first and second sidewalls, (a)(ii) a first cavity including first and second sidewalls each comprising a first dielectric material; (a)(iii) a second dielectric material directly contacting the first and second sidewalls of the first die; (a)(iv) a first layer, on the first die, which includes a first metal interconnect and a third dielectric material; and a second package including a second die; wherein (b)(i) a first horizontal axis intersects the first and second sidewalls of the first die, the first and second sidewalls of the first cavity, and the second dielectric material, but does not intersect the first layer and does not intersect the second die, (b)(ii) a second horizontal axis intersects the first metal interconnect the third dielectric material, and (b)(iii) a vertical axis intersects the first and second dies.

Example 18 includes the system of example 17 comprising at least one solder ball that couples the first die to the second die.

Example 19 includes the system of example 17 comprising: a void between first and second dies and having a lower boundary defined at least in part by an upper surface of the first package and an opposing second boundary defined at least in part by a lower surface of the second package; wherein (c)(i) a portion of the upper surface of the first package directly over the first die is a first distance away from the first layer, (c)(ii) a second portion of the upper surface of the first package that is not directly over the first die is a second distance away from the first layer, and (c)(iii) the first distance is greater than the second distance.

Example 20 includes the system of example 19 wherein: the vertical axis intersects the first portion of the upper surface of the first package; and the vertical axis does not intersect the second portion of the upper surface of the first package.

Example 21 includes the system of example 17 wherein the first die includes a processor and the second die includes a memory.

Example 22 includes a method comprising: coupling a sacrificial material to a substrate; forming a first dielectric material adjacent the sacrificial material such that a horizontal axis intersects the first dielectric material and the sacrificial material; forming a first layer, on the first dielectric material and the sacrificial material, which includes a first metal interconnect and a third dielectric material; decoupling the substrate from the first dielectric material and the sacrificial material; removing the sacrificial material to form an empty cavity with sidewalls comprising the first dielectric material; after removing the sacrificial material to form the empty cavity, inserting a first die into the empty cavity; and forming a second dielectric material between the first dielectric material and the first die such that the horizontal axis intersects the first and second dielectric materials and the first die.

In various embodiments the cavity may be laser drilled.

Example 23 includes the method of example 22 comprising forming an interconnect through the first dielectric material, wherein a first vertical axis intersects the interconnect but does not intersect the first die after the first die is inserted into the empty cavity.

Example 24 includes the method of example 23 comprising forming the interconnect through the first dielectric before decoupling the substrate from the first dielectric material and the sacrificial material.

Example 25 includes the method of example 23 comprising forming the interconnect through the first dielectric after decoupling the substrate from the first dielectric material and the sacrificial material.

Example 26 includes a system comprising: a memory; and a processor coupled to the memory, wherein at least one of the processor and the memory are included in the first die and the package according to any one of examples 1 to 21.

Example 27 includes the package according to any one of examples 1 to 2 and 5 to 21 wherein the first and second dielectric materials include different material compositions from each other.

Example 28 includes the package according to any one of examples 1 to 2 and 5 to 21 wherein the first and second dielectric materials have substantially equal material compositions to one another.

Example 29 includes the package according to any one of examples 1 to 4 and 8 to 21 wherein the first metal interconnect includes a via that is completely filled with at least one metal.

Example 30 includes the package according to any one of examples 1 to 4 and 8 to 21 comprising at least one solder ball, wherein the first layer is between the at least one solder ball and the first die.

Example 31 includes the package according to any one of examples 1 to 4, 6, and 8 to 21 wherein a first vertical axis intersects the first layer and the first die.

Example 32 includes the package according to any one of examples 1 to 11 and 12 to 21 wherein the second dielectric material directly contacts the first die at a location between the first die and the first layer.

Example 33 includes the package according to any one of examples 1 to 11 and 13 to 21 wherein the second dielectric material directly contacts the first die at a location between the first die and the first layer.

Example 34 includes the package according to any one of examples 1 to 12 and 14 to 21 wherein the first and second dielectric materials are not monolithic with each other.

Example 35 includes the package according to any one of examples 1 to 13 and 15 to 21 comprising a second die, wherein the first horizontal axis intersects the first and second dies.

Example 36 includes the package according to any one of examples 1 to 15 and 17 to 21 wherein the package does not include a through silicon via (TSV).

Example 37 includes the package according to any one of examples 17 to 18 and 20 to 21 comprising: a void between first and second dies and having a lower boundary defined at least in part by an upper surface of the first package and an opposing second boundary defined at least in part by a lower surface of the second package; wherein (c)(i) a portion of the upper surface of the first package directly over the first die is a first distance away from the first layer, (c)(ii) a second portion of the upper surface of the first package that is not directly over the first die is a second distance away from the first layer, and (c)(iii) the first distance is greater than the second distance.

Example 38 includes the package according to any one of examples 17 to 19 and 21: the first vertical axis intersects the first portion of the upper surface of the first package; and the first vertical axis does not intersect the second portion of the upper surface of the first package.

Example 39 includes the system of example 17 comprising at least one interconnect means that couples the first die to the second die.

Example 40 includes the package of example 5 comprising at least one interconnect means, wherein the first layer is between the at least one interconnect means and the first die.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A semiconductor package comprising:
   a first die including first and second sidewalls;
   a first cavity including first and second sidewalls each comprising a first dielectric material;
   a second dielectric material directly contacting the first and second sidewalls of the first die;
   a first layer, on the first die, which includes a first metal interconnect and a third dielectric material;
   a second die including first and second sidewalls;
   a second cavity including first and second sidewalls each comprising the first dielectric material;
   wherein (a) a first horizontal axis intersects the first and second sidewalls of the first die, the first and second sidewalls of the first cavity, and the second dielectric material, but does not intersect the first layer, and (b) a second horizontal axis intersects the first metal interconnect and the third dielectric material;
   wherein the first dielectric material directly contacts the second dielectric material along a seam and the first horizontal axis intersects the first seam;
   wherein the first metal interconnect includes a via that is completely filled with at least one metal;
   wherein the first and second dielectric materials are not monolithic with each other;
   wherein the first layer includes a thin film redistribution layer (RDL);
   wherein the package is coreless;
   wherein the first die couples to the first layer with a second metal interconnect;
   wherein the second metal interconnect is between the first die and the first layer;
   wherein the second dielectric material directly contacts the first and second sidewalls of the second die; and
   wherein the first layer is on the second die;
   wherein the first horizontal axis intersects the first and second sidewalls of the second die, and the first and second sidewalls of the second cavity;
   wherein at least a portion of the second dielectric directly contacts the first and second dies and the portion of the second dielectric extends uninterrupted from the first die to the second die.

2. The package of claim 1 wherein the first and second dielectric materials include different material compositions from each other.

3. The package of claim 1 wherein the first and second dielectric materials have substantially equal material compositions to one another.

4. The package of claim 1 comprising at least one solder ball, wherein the first layer is between the at least one solder ball and the first die.

5. The package of claim 1 wherein a first vertical axis intersects the first layer and the first die.

6. The package of claim 5 wherein the first and second sidewalls of the first cavity are substantially parallel to the first vertical axis.

7. The package of claim 5 wherein the first and second sidewalls of the first cavity are: (a) not parallel to the first vertical axis, (b) not parallel to the first horizontal axis, and (c) tapered.

8. The package of claim 5 wherein the first vertical axis intersects the second dielectric material.

9. The package of claim 8 wherein the second dielectric material directly contacts the first die at a location between the first die and the first layer.

10. The package of claim 1 wherein the second dielectric material directly contacts the first die at a location between the first die and the first layer.

11. The package of claim 1 wherein the package does not include a through silicon via (TSV).

* * * * *